United States Patent
Kathuria et al.

(10) Patent No.: US 11,152,944 B2
(45) Date of Patent: Oct. 19, 2021

(54) TERMINATION CALIBRATION SCHEME USING A CURRENT MIRROR

(71) Applicant: Advanced Micro Devices, Inc., Santa Clara, CA (US)

(72) Inventors: Achal Kathuria, Sunnyvale, CA (US); Pradeep Jayaraman, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 24 days.

(21) Appl. No.: 16/570,334

(22) Filed: Sep. 13, 2019

(65) Prior Publication Data

US 2021/0083677 A1   Mar. 18, 2021

(51) Int. Cl.
    *H03K 19/01*     (2006.01)
    *H03K 21/08*     (2006.01)
    *H03K 5/24*     (2006.01)

(52) U.S. Cl.
    CPC .............. *H03K 21/08* (2013.01); *H03K 5/24* (2013.01); *H03K 19/01* (2013.01)

(58) Field of Classification Search
    CPC ...... H03K 19/0005; H03K 19/01; H03K 5/24; H04L 25/0278; H04L 25/0298
    See application file for complete search history.

(56) References Cited

U.S. PATENT DOCUMENTS

| | | | |
|---|---|---|---|
| 6,720,804 B2 | 4/2004 | Taguchi et al. | |
| 6,924,660 B2* | 8/2005 | Nguyen | H03K 5/24 326/30 |
| 6,937,111 B2 | 8/2005 | Kwon | |
| 6,944,071 B2 | 9/2005 | Martin | |
| 6,992,501 B2 | 1/2006 | Rapport | |
| 7,034,565 B2 | 4/2006 | Lee | |
| 8,384,424 B2* | 2/2013 | Cho | H03K 19/017581 326/30 |
| 8,487,650 B2* | 7/2013 | Fazeel | G11C 29/025 326/30 |

OTHER PUBLICATIONS

Tyan, Eer-Wen, U.S. Appl. No. 11/147,002, entitled "Low Power Termination Circuit", filed Jun. 7, 2005, 15 pages.

* cited by examiner

*Primary Examiner* — Patrick O Neill
(74) *Attorney, Agent, or Firm* — Rory D. Rankin; Kowert, Hood, Munyon, Rankin & Goetzel, P.C

(57) ABSTRACT

Systems, apparatuses, and methods for conveying and receiving information as electrical signals in a computing system are disclosed. A computing system includes multiple transmitters sending singled-ended data signals to multiple receivers. A termination voltage is generated and sent to the multiple receivers. The termination voltage is coupled to each of signal termination circuitry and signal sampling circuitry within each of the multiple receivers. Any change in the termination voltage affects the termination circuitry and affects comparisons performed by the sampling circuitry. Received signals are reconstructed at the receivers using the received signals, the signal termination circuitry and the signal sampling circuitry.

20 Claims, 6 Drawing Sheets

TERMINATION CALIBRATION SCHEME USING A CURRENT MIRROR

BACKGROUND

Description of the Related Art

When transferring information between functional blocks in a semiconductor chip, electrical signals are sent on multiple, parallel metal traces. Transmitters in a first functional block send the electrical signals across the parallel metal traces. Receivers in a second functional block receive the electrical signals. In some designs, the functional blocks include transceivers for transmitting electrical signals for a particular time interval and receiving electrical signals for another time interval. In some cases, the two functional blocks are within a same die. In other cases, the two functional blocks are on separate dies. In either case, the metal traces have transmission line effects such as distributed inductance, capacitance and resistor throughout its length. For modern integrated circuits, the interconnect capacitance reduces signal integrity and signal transfer rate more so than gate capacitance of semiconductor devices.

The interconnect capacitance per unit length includes both sidewall fringing capacitance and cross-coupling capacitance. For example, the electromagnetic fields for the metal traces conducting signals and the return current on the ground plane create electrical interference on neighboring metal traces and on adjacent devices. As the operating voltage continues to decrease to reduce power consumption, the signal swing used for Boolean logic decreases as well as the noise margin. In addition, communication protocols are updated over time, which causes current design solutions at interfaced to become outdated.

In view of the above, efficient methods for conveying and receiving information as signals in a computing system are desired.

BRIEF DESCRIPTION OF THE DRAWINGS

The advantages of the methods and mechanisms described herein may be better understood by referring to the following description in conjunction with the accompanying drawings, in which.

Figure 1:
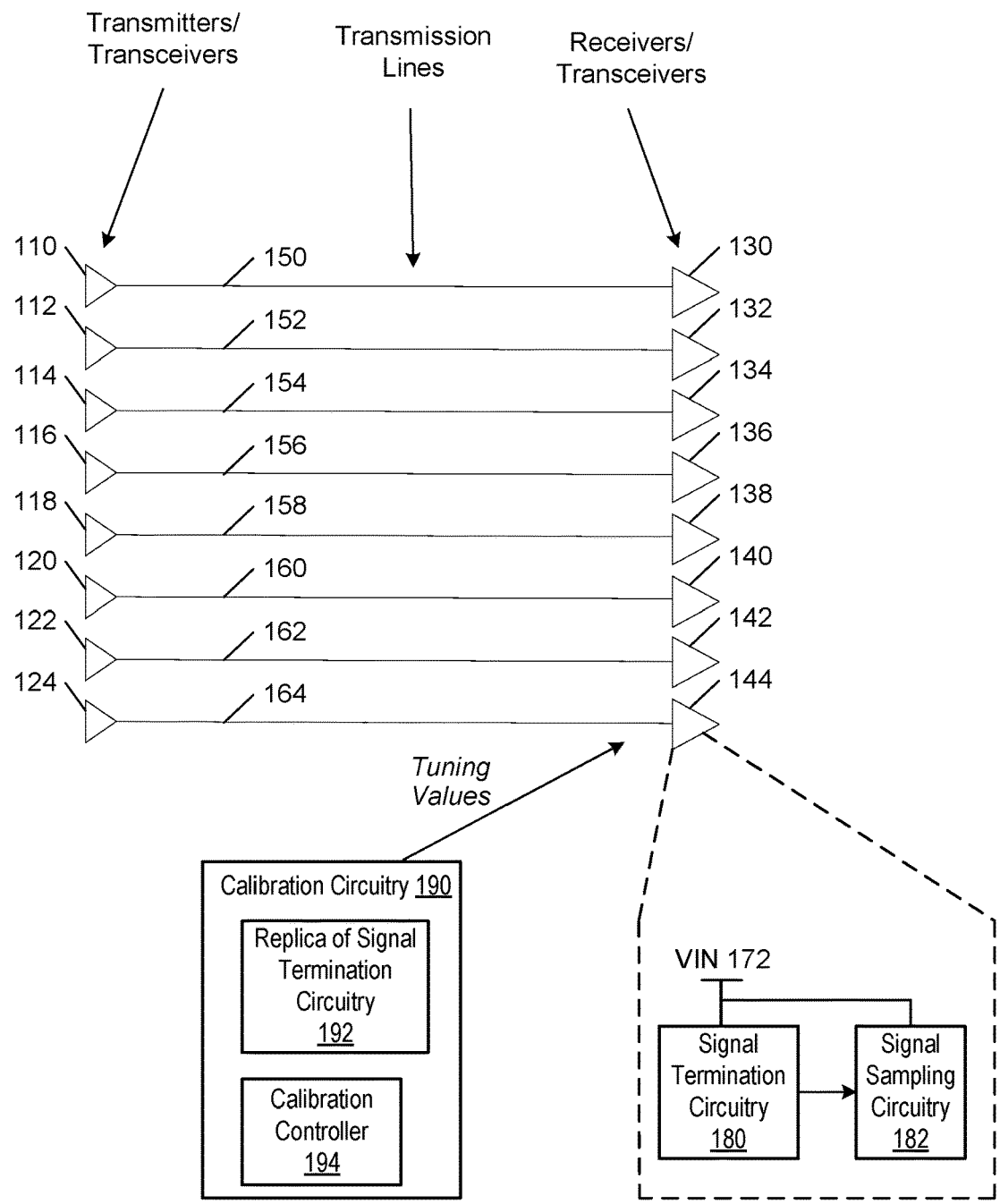
FIG. 1 is a block diagram of one embodiment of a communication bus.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for conveying and receiving information as electrical signals in a computing system are disclosed. In various embodiments, a computing system includes one or more functional blocks for processing applications. Examples of the functional blocks include a general-purpose central processing unit (CPU), a graphics processing unit (GPU), an accelerated processing unit (APU), an input/output (I/O) device, a memory controller for system memory, and so forth. The computing system also includes multiple interfaces for transferring data between the functional blocks. In some cases, two functional blocks transferring data between one another are within a same die. In other cases, the two functional blocks are on separate dies.

When transferring information between functional blocks, electrical signals are sent on multiple, parallel metal traces. One or more of transmitters and transceivers in a first functional block send the electrical signals across the parallel metal traces. One or more of receivers and transceivers in a second functional block receive the electrical signals. In either case, the metal traces have transmission line effects, such as distributed inductance, capacitance and resistor throughout the line length. In some embodiments, each receiver includes circuitry for electrostatic discharge protection and sampling circuitry for reconstructing the received input signal. The sampling circuitry receives the input signal after the termination circuitry and the protection circuitry. The sampling circuitry reconstructs the input signal by comparing the received input signal to a reference voltage.

To reduce signal reflection, the far end (receiving end) of the metal traces are terminated using the characteristic impedances of the metal traces. In some embodiments, on-die termination (ODT) is used where one or more of a pullup termination resistor and a pulldown termination resistor for impedance matching are located inside the receiver instead of externally from the receiver such as off-chip on a printed circuit board (PCB) or on a system on a chip (SOC) or multichip module (MCM). By placing the termination resistors on the die rather than off-chip, the reflections resulting from discontinuities in the line are reduced. When signal noise is reduced on the transmission lines, faster data rates are possibly used to transfer information between functional blocks.

In an embodiment, a communication protocol specifies that a signal interface uses one or more ODT pulldown termination resistors and one or more ODT pullup termination resistors equal to target resistors. In addition, the communication protocol specifies a target voltage, which is a percentage of the supply voltage. The supply voltage is a maximum voltage level of signals transmitted over signal lines. The target voltage indicates a voltage level that is a degraded form of the supply voltage and still provides a minimally acceptable data transfer rate. For example, the target voltage is two thirds, fourth fifths, or another fraction of the supply voltage. In some embodiments, the communication protocol also determines a value for a reference resistor. As used herein, the "reference resistor" is also referred to as the "external precision resistor." In various embodiments, the reference resistor is temperature-independent unlike the multiple copies of the on-die termination (ODT) configurable pullup and pulldown resistors.

In various embodiments, within one or more of a transmitter and a transceiver, calibration circuitry includes at least a configurable calibration pulldown resistor, which is a replica copy of an on-die termination (ODT) configurable pulldown resistor. During a calibration stage of operation, a calibration controller of the calibration circuitry adjusts the configurable calibration pulldown resistor. When calibration completes, the calibration controller sends an indication to multiple controllers corresponding to the multiple copies of the ODT configurable pulldown resistor. The indication specifies a value of the configurable calibration pulldown resistor at the point in time that the calibration controller determines calibration completed. Therefore, the other controllers are able to tune corresponding ODT configurable pulldown resistors to the same value that is specified in the received indication. In various embodiments, the calibration circuitry also includes a configurable calibration pullup resistor, which is used for tuning corresponding ODT configurable pullup resistors.

In addition to the configurable calibration pulldown resistor, the calibration circuitry also includes a current source that conveys a reference current and a calibration current based on the reference current. In various embodiments, the current source is a current mirror. However, in various embodiments, rather than use a cascode or similar transistor configuration to implement the current mirror, the calibration circuitry includes a resistor in series with a switch, such as a p-type metal oxide semiconductor (PMOS) field effect transistor (FET), which is also referred to as a "pfet". In some embodiments, the calibration current is greater than the reference current. The current source generates a first voltage by conveying, through the reference resistor, the reference current. The current source also generates a second voltage by conveying, through the configurable calibration pulldown resistor, the calibration current that is based on the reference current.

While the calibration controller adjusts the configurable calibration pulldown resistor from an initial (resistance) value, the change in the second voltage affects the value of the first voltage. A comparator of the calibration circuitry compares the first voltage to a reference voltage. The reference voltage is based on the target voltage. When the comparator determines that its output has not changed from an initial output value, this lack of an output change indicates to the calibration controller that this particular stage of calibration is not yet complete. In response, the calibration controller continues to adjust, or tune, the configurable calibration pulldown resistor from its initial (resistance) value. When the comparator determines that its output changes from the initial output value, this output change indicates to the calibration controller that this particular stage of calibration has completed. The calibration controller stores the final tuned value of the configurable calibration pulldown resistor.

In some embodiments, the calibration controller performs the above steps twice. During a first stage of calibration, the calibration controller uses a minimum value of the configurable calibration pulldown resistor as the initial value and tunes by increasing the configurable calibration pulldown resistor. During a second stage of calibration, the calibration controller uses a maximum value of the configurable calibration pulldown resistor as the initial value and tunes by decreasing the configurable calibration pulldown resistor. The calibration controller averages the two final values of the configurable calibration pulldown resistor determined during the two stages of calibration. Afterward, the calibration controller sends the average result as the indication to the multiple controllers corresponding to the multiple copies of the ODT configurable pulldown resistor.

Referring to FIG. 1, a generalized block diagram of one embodiment of a communication bus 100 is shown. As shown, communication bus 100 includes transmitters 110-124 for sending information as electrical signals, transmission lines 150-164 for transferring the electrical signals, and receivers 130-144 for receiving the signals. In addition, communication bus 100 includes calibration circuitry 190, which includes replica of signal termination circuitry 192 and a calibration controller 194. Although eight transmitters 110-124, eight transmission lines 150-164, eight receivers 130-144, and a single instance of calibration circuitry 190 are shown, in other embodiments, any number of these components is used. In some embodiments, a bus with 40 transmission lines uses five instantiations of communication bus 100, so each set of eight receivers 130-144 includes an instance of the calibration circuitry 190. It is noted that the term "bus" may also be referred to as a "channel," and each "transmission line" is a "lane" or a "trace" or a "wire." In various embodiments, transmission lines 150-164 are constructed from a variety of suitable metal sources during semiconductor fabrication and surrounded by a variety of any suitable insulating material. It is also noted that the terms "pin," "port," "terminal," and "node" are used interchangeably herein.

In some embodiments, one or more of transmitters 110-124 and receivers 130-144 are transceivers that include circuitry for both transmitting signals and receiving signals. The circuitry of a transceiver determines a mode of operation such as a transmitting mode and a receiving mode. Based on the mode of operation, the circuitry of the transceiver enables some portions of circuitry used by the mode of operation and disables other portions of circuitry unused by the mode of operation. In some embodiments, communication bus 100 includes a termination voltage (VTT) generator for generating a termination voltage (VTT) used by one or more of the receivers 130-144. For example, in some embodiments, one or more of the receivers 130-144 uses the VTT 172 in termination circuitry and sampling circuitry. In the illustrated embodiment, receiver 144 includes termination circuitry 180 and sampling circuitry 182.

In some embodiments, the signals sent from transmitters 110-124 to receivers 130-144 are single-ended data signals. The term "single-ended signal" is defined as an electric signal which is transmitted using a single signal conductor. For example, in an embodiment, receiver 130 receives a single-ended signal from transmitter 110 via transmission line 150, which is a single signal conductor. In contrast to using single-ended data signals, sending information with differential data signals uses more lines and more pins. A reference signal is not generated and sent to multiple pins (or multiple receivers) when differential data signals are used.

As is known in the art, differential signaling generally provides better noise immunity than single-ended signaling. However, the use of differential signaling comes at the added cost of extra pins and extra traces.

As shown in FIG. 1, values transmitted as electrical signals on transmission lines 150-164 are received by each of the signal termination circuitry 180 and the signal sampling circuitry 182. For example, in an embodiment, the signal sampling circuitry 182 receives a value generated by the signal termination circuitry 180 and compares it to a reference voltage, such as VTT. In some embodiments, the value generated by the signal termination circuitry 180 is based on a current-resistor (IR) voltage drop across a termination resistor. By limiting the noise received on signals from the transmission lines 150-164, the common mode noise received by samplers within the receivers 130-144 is also reduced.

In some embodiments, a communication protocol specifies that a signal interface uses one or more ODT pulldown termination resistors equal to a predetermined target resistor. In addition, the communication protocol specifies a target voltage, which is a percentage of the supply voltage. The target voltage indicates a voltage level that is a degraded form of the supply voltage and still provides a minimally acceptable data transfer rate based on the communication protocol. One example of a communication protocol is the graphics double data rate type six (GDDR6). The GDDR6 protocol is a protocol used for synchronous random access memory (RAM) used in graphics cards, game consoles, high-performance computing, and so on.

In various embodiments, calibration circuitry 190 includes one or more configurable calibration resistors in the replica circuitry 192, which are replicas of on-die termination (ODT) configurable pullup and pulldown resistors used in receivers 130-144. This configurable calibration pulldown resistor in the replica circuitry 192, and the ODT configurable pulldown resistors in one or more of the transmitters 110-124 and the receivers 130-144, vary in resistor due to variations in semiconductor fabrication processes, operating temperatures, and operating voltage levels. Therefore, these resistors are tunable.

When calibration of communication bus 100 completes, the calibration controller 194 sends an indication to a controller in one or more of the transmitters 110-124 and the receivers 130-144 that specifies a value of the configurable calibration pulldown resistor at the point in time that the calibration controller 194 determines calibration completed. Therefore, the other controllers are able to tune corresponding ODT configurable pulldown resistors to the same value that is specified in the received indication. In various embodiments, the calibration circuitry 194 uses a one stage (or one step) calibration process for calibrating the configurable calibration pulldown resistor used to model the ODT configurable pulldown resistor in one or more of the transmitters 110-124 and the receivers 130-144. Therefore, the calibration circuitry 190 does not rely on a two stage (or two step) calibration process that calibrates a replica of an ODT configurable pullup resistor prior to calibrating the replica of the ODT configurable pulldown resistor.

Figure 2:
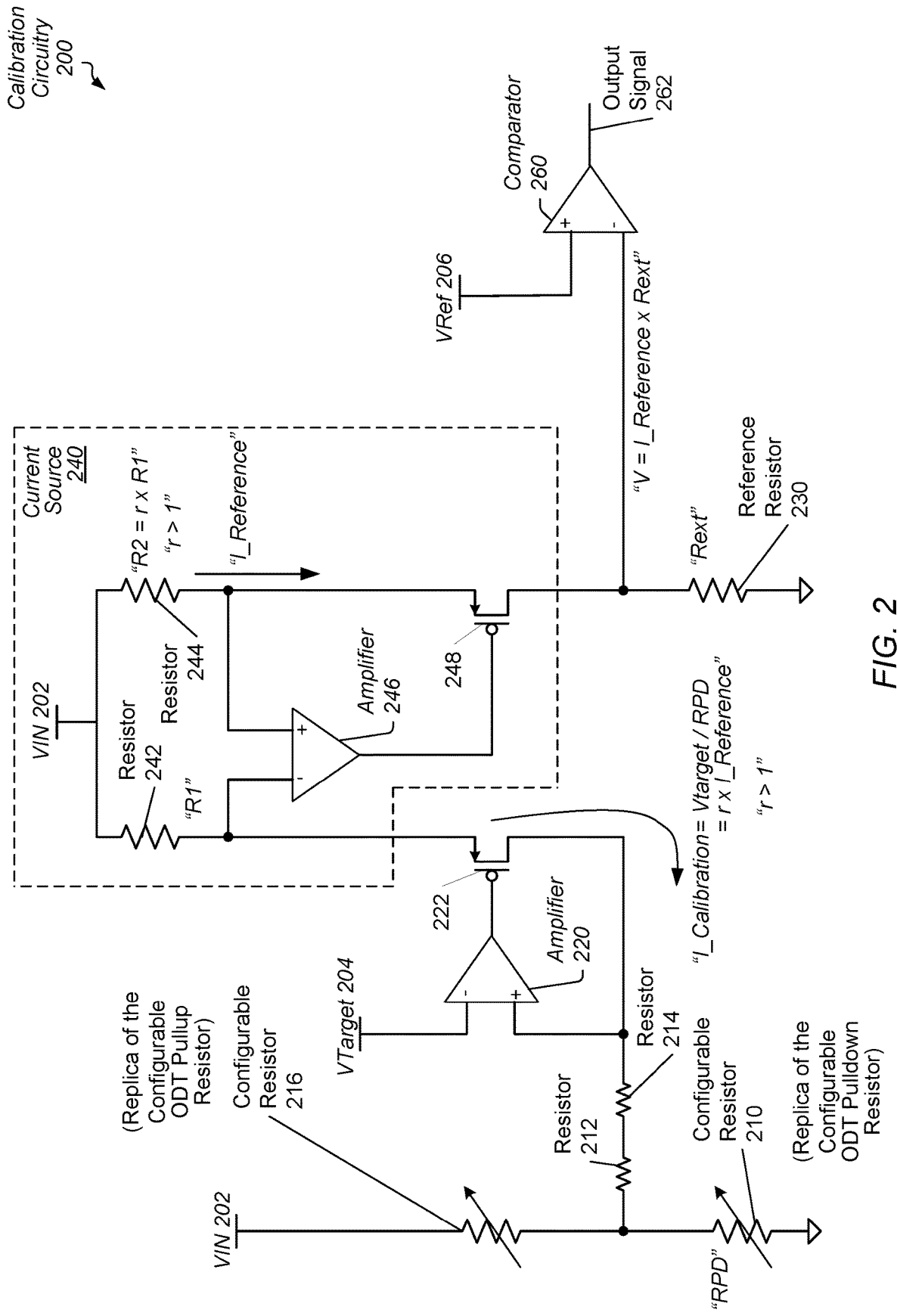
FIG. 2 is a block diagram of one embodiment of calibration circuitry.

Turning now to FIG. 2, a generalized block diagram of one embodiment of calibration circuitry 200 is shown. In the illustrated embodiment, calibration circuitry 200 includes configurable resistor 210, which is a replica of a configurable ODT pulldown resistor in external receiver and/or transceiver circuitry. In some embodiments, calibration circuitry 200 includes the configurable resistor 216, which is a replica of a configurable ODT pullup resistor in external receiver and/or transceiver circuitry. The configurable resistor 216 provides a model of the loading in actual receiver or transceiver circuitry. In other embodiments, the calibration circuitry 200 does not include the configurable resistor 216, but rather, the calibration circuitry 200 includes a lumped capacitance, a distributed capacitance or other model of the loading provided by the configurable ODT pullup resistor in on-die termination circuitry. Calibration circuitry 200 also includes the amplifier 220 and the comparator 260, the reference resistor 230 and the current source 240. Calibration circuitry 200 is used during a calibration stage/mode of operation, and calibration circuitry 200 models the on-die termination resistors in actual on-die termination circuitry in one or more of transmitters, receivers and transceivers.

It is noted that other embodiments of calibration circuitry 200 have a different number of components as shown in FIG. 2. For example, other embodiments can have more or less components than calibration circuitry 200. In some embodiments, calibration circuitry 200 includes one or more switches (not shown) for enabling and disabling components. In other embodiments, the supply voltage, which is referred to as the input voltage (VIN) 202, is enabled by control circuitry external to the calibration circuitry 200.

Termination circuitry is used to prevent reflection on the external transmission line ending at an input pin (not shown) connected to the node between the configurable resistor 210 and the configurable resistor 216 in actual on-die termination circuitry. Reflection at any impedance change point on the external transmission line including the end of a transmission line at receiver front-end 200 results in signal distortion, signal ringing and so forth. In various embodiments, a calibration controller, which is not shown for ease of illustration, is capable of being setting the configurable resistor 210 at two or more predetermined values. For example, in an embodiment, the configurable resistor 210 is capable of being set from 50 ohms to 200 ohms with a 50 ohm step. In other embodiments, a wider range and a finer granularity for settings of the configurable resistor 210 are used. In an embodiment, the resistors 212 and 214 model the series resistor and inductance effects on the configurable resistor 210 when an input signal is received from a transmission line.

In some embodiments, a communication protocol specifies that a signal interface uses one or more ODT pulldown termination resistors equal to a predetermined target resistor. In addition, the communication protocol specifies a target voltage, VTarget 204, which is a percentage of the supply voltage VIN 202. The target voltage VTarget 204 indicates a voltage level that is a degraded form of the supply voltage VIN 202 and still provides a minimally acceptable data transfer rate based on the communication protocol. For example, the target voltage VTarget 204 is two thirds, fourth fifths, or another fraction of the input voltage VIN 202 while the target ODT pulldown termination resistor 210 is 48 ohms. However, a variety of other values for the target voltage and ODT pulldown termination resistor are possible and contemplated.

In addition, the communication protocol determines a value for the reference resistor 230. In some embodiments, the reference resistor 230 is temperature-independent unlike the configurable pulldown resistor 210. The reference resistor 230 is also referred to as the "external precision resistor" 230. In one embodiment, the reference resistor 230 is 120 ohms, although other values are possible and contemplated in other embodiments. One example of a communication protocol for setting values for the reference resistor 230, VTarget 204, and a target value for the configurable resistor 210 is the graphics double data rate type six (GDDR6). The GDDR6 protocol is a protocol used for synchronous random access memory (RAM) used in graphics cards, game consoles, high-performance computing, and so on.

In various embodiments, the current source 240 is a current mirror. The current source 240 conveys a reference current through the pfet 248 and the reference resistor 230. The current source 240 also conveys a calibration current through the pfet 222 and the series combination of the resistors 212 and 214 and the configurable resistor 210. In various embodiments, the calibration current is based on the reference current. In some embodiments, the calibration current is greater than the reference current. In an embodiment, the calibration current flowing through the pfet 222 is a multiple of the reference current flowing through the pfet 248 and the multiplication factor is 3, 4, 8 or other. As shown, the multiplication factor is indicated by "r>1" where "r" is a positive, non-zero value greater than one. In some embodiments, the multiplication factor "r" is an integer, whereas, in other embodiments, the multiplication factor "r" is a non-integer.

In various embodiments, the amplifier 220 is implemented as an operational amplifier. The amplifier 220 ensures that the voltage across the resistors 210, 212 and 214 is equal to the target voltage (VTarget) 204 by adjusting the gate voltage of the pfet 222. The amplifier 220 amplifies any difference between the drain voltage of the pfet 222 to the target voltage (VTarget) 204. The amplifier 220 limits the maximum value on the drain terminal of the pfet 222 to being near VTarget 204. In an embodiment, VRef 206 is equal to VTarget 204. In another embodiment, VRef 206 is determined from the values for VTarget 204, the configurable resistor 210 and the reference resistor 230 determined by the communication protocol. In addition, VRef 206 is determined from the reference current sourced by the current source 240. In one embodiment, VRef 206 is the product of the reference current sourced by the current source 240 and the reference resistor 230.

In various embodiments, rather than use a cascode or similar transistor configuration to implement a current mirror, the current source 240 includes a resistor in series with a switch. As shown, current source 240 includes the resistor 244 in series with the pfet 248. In addition, current source 240 includes the resistor 242 in series with the pfet 222. In some embodiments, the resistor 244 has a resistance that is greater than a resistance of the resistor 242. In an embodiment, the resistor 244 has a resistance that is a multiple of the resistor of the resistor 242 and the multiplication factor is 3, 4, 8 or other. Similar to the calibration current being greater than the reference current by the multiplication factor, the resistor 244 is greater than resistor 242 by the multiplication factor. As described earlier, the multiplication factor is indicated by "r>1" where "r" is a positive, non-zero value greater than one. In some embodiments, the multiplication factor "r" is an integer, whereas, in other embodiments, the multiplication factor "r" is a non-integer.

The current source 240 also includes the amplifier 246, which amplifies a difference between the source voltages of the pfets 222 and 248. The amplifier 246 adjusts the gate voltage of the pfet 248 when the source voltages of the pfets 222 and 248 differ. Therefore, the amplifier 246 ensures that the voltages at the ends of the resistors 242 and 244 away from the supply voltage VIN 202 are equal to one another or within a threshold voltage of one another. By equating these voltages, the current source 240 is capable of generating mirrored currents.

During a calibration stage of operation, an external calibration controller sets the configurable resistor 210 to an initial value. For example, the calibration controller sets the configurable resistor 210 to a maximum resistor value, which is larger than the target resistor specified by the communication protocol. Therefore, the calibration current flowing through the pfet 222 is small. As described above, the calibration current is greater than the reference current. The reference current flows through the reference resistor 230, which provides a small voltage to the input of the comparator 260. This small voltage is less than VRef 206, and comparator 260 conveys an indication on the output signal 262 to the external calibration controller. The indication specifies an initial result such as a logic low level.

The calibration controller continues to adjust, or tune, the configurable resistor 210. In an embodiment, the calibration controller continues to reduce the resistor of the configurable resistor 210 from the initial maximum resistor value until the comparator 260 generates a result that is different from the initial result. The generated different result on the output signal 262 indicates that the drain voltage of pfet 248 has risen above VRef 206. The calibration controller stores one or more of the value of the configurable resistor 210 and the setting used to set the configurable resistor 210 to its current value.

In some embodiments, the calibration controller conveys information to one or more external controllers for setting pulldown termination resistors in receivers and/or transceivers on a signal interface. The information includes one or more of the resistor of the configurable resistor 210 and the setting used to set this resistor. In other embodiments, prior to sending information to the one or more external controllers, the calibration controller sets the configurable resistor 210 to another initial value. For example, the calibration controller sets the configurable resistor 210 to a minimum resistor value, which is smaller than the target resistor specified by the communication protocol. Therefore, the calibration current flowing through the pfet 222 is large. The calibration current is based on the reference current due to the current source 240, and the reference current provides a large voltage to the input of the comparator 260. This large voltage is greater than VRef 206, and comparator 260 conveys an indication on the output signal 262 to the external calibration controller. The indication specifies another initial result such as a logic high level.

The calibration controller continues to adjust, or tune, the configurable resistor 210. In an embodiment, the calibration controller continues to increase the resistor of the configurable resistor 210 from the initial minimum resistor value until the comparator 260 generates a result that is different from the initial result. The generated different result on the output signal 262 indicates that the drain voltage of pfet 248 has fallen below VRef 206. The calibration controller stores one or more of the value of the configurable resistor 210 and the setting used to set the configurable resistor 210 to its current value. In one embodiment, the calibration controller generates an average of the two stored resistors corresponding to the configurable resistor 210. Additionally, the calibration controller determines a setting for providing the average resistor. In various embodiments, the calibration controller conveys information to one or more external controllers for setting pulldown termination resistors in receivers and/or transceivers on a signal interface. The information includes one or more of the average resistor of the configurable resistor 210 and the setting used to set this average resistor.

Figure 3:
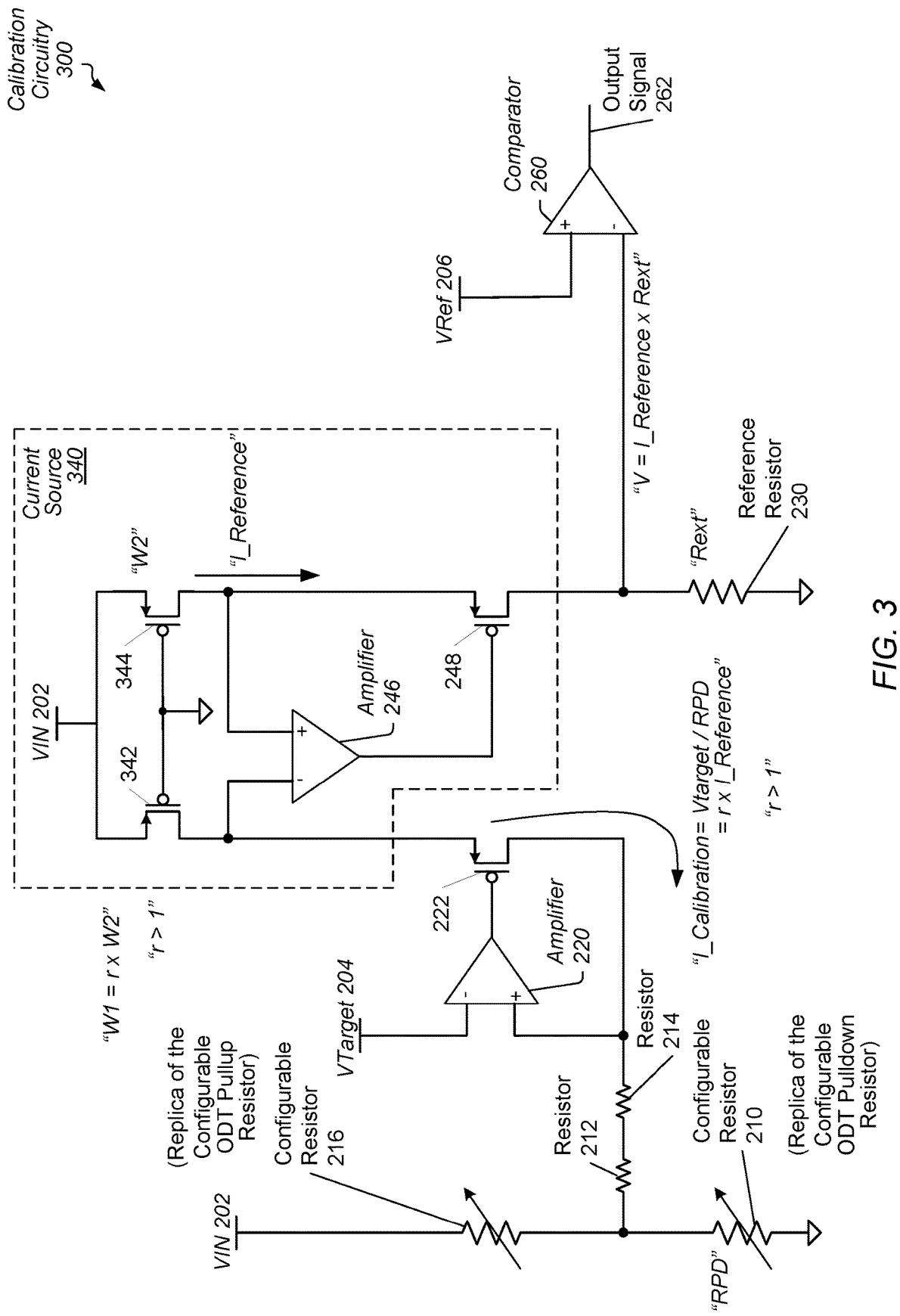
FIG. 3 is a block diagram of one embodiment of calibration circuitry.

Referring to FIG. 3, a generalized block diagram of one embodiment of calibration circuitry 300 is shown. Circuitry and logic previously described are numbered identically. In some embodiments, the positive polarity terminal of the comparator 260 is connected to the drain terminal of pfet 222, rather than to VRef 206. However, in the illustrated embodiment, the positive polarity is connected to VRef 206. As shown, the calibration circuitry 300 includes the current source 340. In various embodiments, the current source 340 is a current mirror. The current source 340 conveys a reference current through the pfet 248 and the reference resistor 230. The current source 340 also conveys a calibration current through the pfet 222 and the series combination of the resistors 212 and 214 and the configurable resistor 210. In various embodiments, the calibration current is based on the reference current. In some embodiments, the calibration current is greater than the reference current. In an embodiment, the calibration current flowing through the pfet 222 is a multiple of the reference current flowing through the pfet 248 and the multiplication factor is 3, 4, 8 or other. As shown, the multiplication factor is indicated by "r>1".

In contrast to using passive components such as resistors, current source 340 uses active components such as pfets 342 and 344. In an embodiment, each of the pfets 342 and 344 remain enabled since their gate terminals receive the ground reference voltage level. In some embodiments, the device width of pfet 342 is greater than a device width of the pfet 344. In an embodiment, the device width of the pfet 342 is a multiple of the device width of the pfet 344 and the multiplication factor is 3, 4, 8 or other. As shown, the multiplication factor is indicated by "r>1".

In some embodiments, one or more of the calibration circuitry 190 (of FIG. 1), calibration circuitry 200 (of FIG. 2) and calibration circuitry 300 are used in a memory interface for one of a variety of types of dynamic RAM (DRAM). In an embodiment, the interface supports a particular communication protocol. One example is the (GDDR6) protocol for synchronous random access memory (RAM) used in graphics cards, game consoles, high-performance computing, and so on. The memory controller for the DRAM, such as a memory controller for system memory, supports a calibration stage of multiple stages of operation when activating the DRAM. For example, one or more supply voltages are applied to the DRAM in an initial stage. Afterward, a reset stage ends while clock signals are enabled. A calibration stage is performed followed by bringing the DRAM into an idle state. The calibration stage uses one or more of the calibration circuitry 190, 200 and 300 to calibrate at least an ODT termination pulldown resistor such as the configurable resistor 210.

Figure 4:
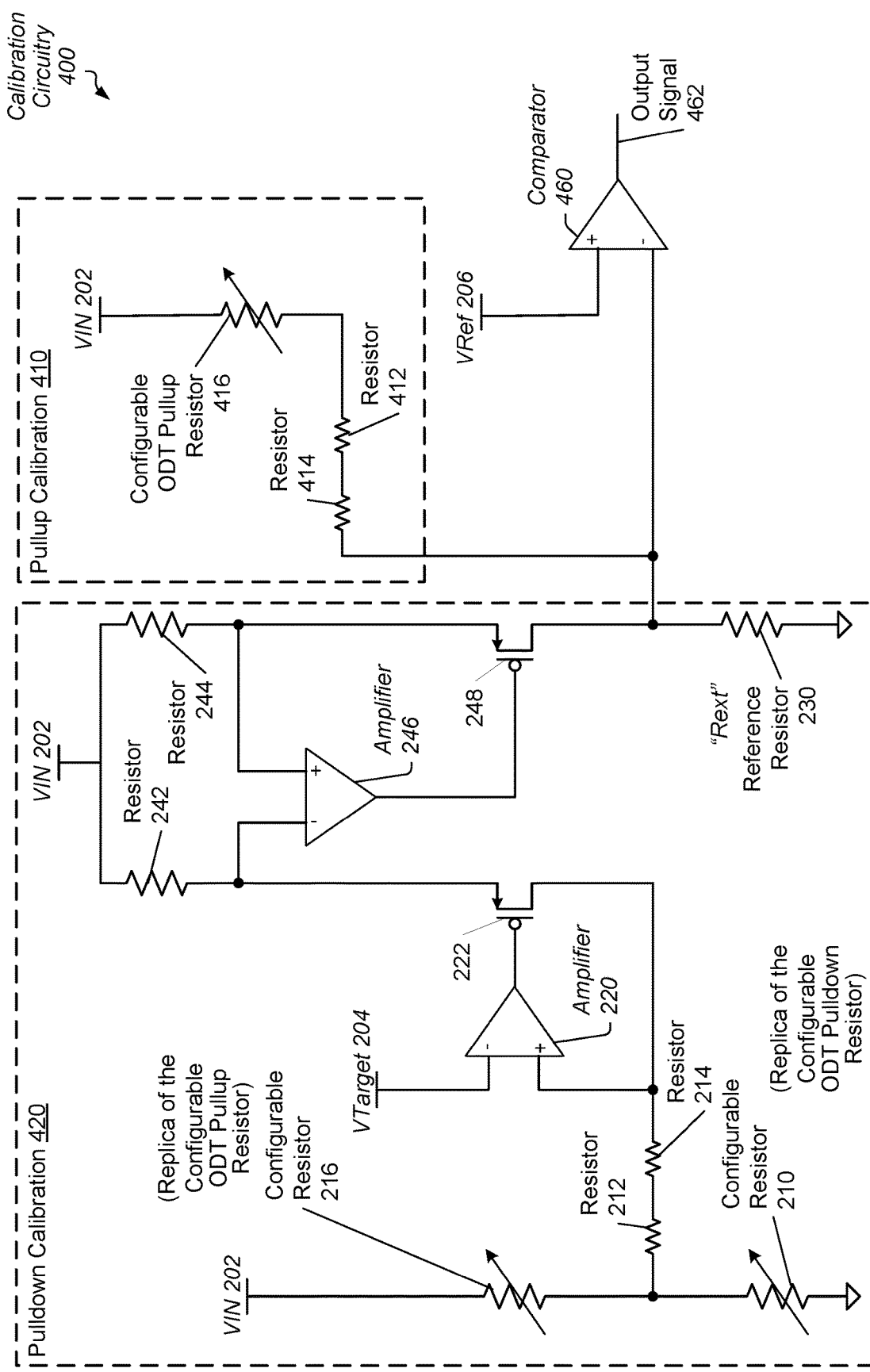
FIG. 4 is a block diagram of one embodiment of calibration circuitry.

Turning now to FIG. 4, a generalized block diagram of one embodiment of calibration circuitry 400 is shown. Circuitry and logic previously described are numbered identically. In the illustrated embodiment, calibration circuitry 400 includes pullup calibration block 410 and pulldown calibration block 420. In an embodiment, pulldown calibration block 420 includes components used in one of calibration circuitry 200 (of FIG. 2) and calibration circuitry 300 (of FIG. 3). Pullup calibration 410 includes a configurable ODT pullup resistor 416 (or configurable pullup resistor 416) between the input supply voltage VIN 202 and the series combination of resistor 412 and resistor 414. In various embodiments, resistors 412 and 414 are used equivalently as resistors 212 and 214.

In various embodiments, when calibration circuitry 400 is used for calibrating the configurable resistor 210, the pullup calibration block 410 is disabled while the pulldown calibration block 420 is enabled. In some embodiments, calibration circuitry 400 includes one or more switches (not shown) for enabling and disabling components. In other embodiments, the supply voltage, which is referred to as the input voltage (VIN) 202, is enabled by control circuitry external to the calibration circuitry 400. In various embodiments, the calibration circuitry 400 and an external calibration controller (not shown) use the steps described earlier for calibrating the configurable resistor 210 (of FIG. 2). Comparator 460 of calibration circuitry 400 conveys the output signal 462 to the external calibration controller to indicate whether to continue tuning the configurable resistor 210 or indicate that calibration has completed.

In an embodiment, when calibration circuitry 400 is used for calibrating the configurable resistor 416, the pullup calibration block 410 is enabled while the pulldown calibration block 420 is disabled. Current flows from the supply voltage VIN 202 to the ground reference voltage level through the series combination of the configurable resistor 416, the resistors 412 and 414, and the reference resistor 230. The comparator 260 compares the voltage drop across the reference resistor 230 to the reference voltage 206 (or VRef 206). The reference resistor 230 forms a voltage divider with the series combination of the configurable resistor 416 and the resistors 412 and 414.

When calibrating the configurable resistor 416, in various embodiments, the calibration circuitry 400 and the external calibration controller (not shown) use steps similar to the steps described earlier for calibrating the configurable resistor 210. For example, the calibration controller sets the configurable resistor 416 to an initial value that is a maximum value for the configurable resistor 416, and tunes the configurable resistor 416 by reducing it until the output signal 462 changes its initial value. Following, the calibration controller begins with an initial value of the configurable resistor 416 that is a minimum value for the configurable resistor 416, and tunes the configurable resistor 416 by increasing it until the output signal 462 changes its initial value. The calibration controller determines an average of the two final values of the configurable resistor 416, and conveys information to one or more external controllers for setting pulldown termination resistors in receivers and/or transceivers on a signal interface. The information includes one or more of the average resistor of the configurable resistor 416 and the setting used to set this average resistor.

Figure 5:
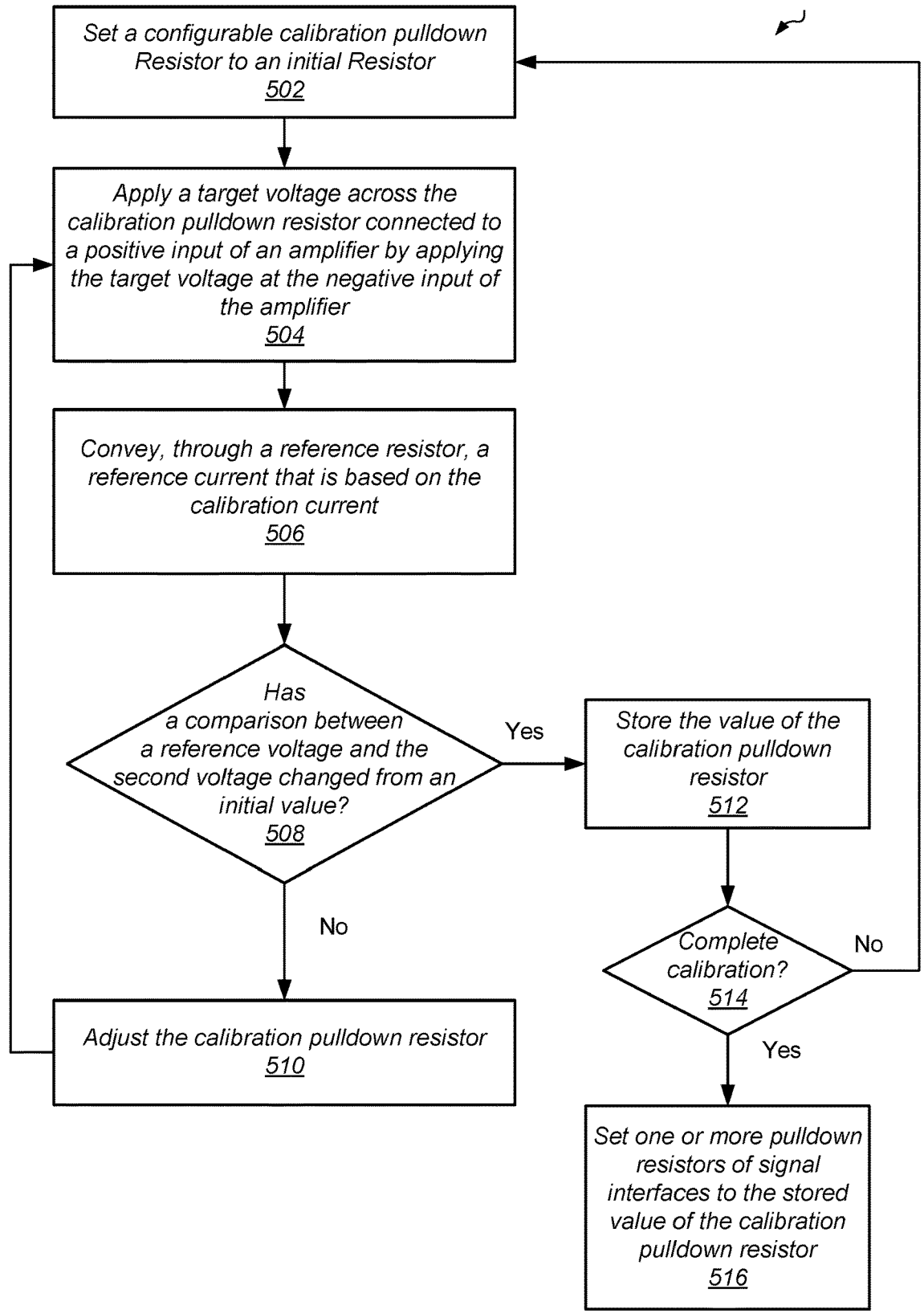
FIG. 5 is a flow diagram of one embodiment of a method for calibrating an on-die termination resistor in a computing system.

Referring now to FIG. 5, one embodiment of a method 500 for calibrating an on-die termination resistor in a computing system is shown. For purposes of discussion, the steps in this embodiment (as well as in FIG. 6) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 500.

During a calibration stage for a signal interface, a replica of each of a configurable (tunable) pullup resistor and a configurable (tunable) pulldown resistor is individually and independently calibrated. In other words, neither of the configurable pullup resistor and the configurable pulldown resistor is dependent on the other for their respective calibration. The separate calibration processes are one step calibration processes instead of dependent two step processes. For the calibration of the configurable pulldown resistor, a replica of the configurable on-die pulldown resistor is calibrated. During the calibration, a calibration controller sets the configurable on-die pulldown resistor to an initial resistor (block 502). In one embodiment, the initial resistor is a maximum resistor for the configurable on-die pulldown resistor (or configurable resistor). In another embodiment, the initial resistor is a minimum resistor for the configurable pulldown resistor.

The calibration controller applies a target voltage across the calibration pulldown resistor (block 504), which is connected to a positive input of an amplifier. In some embodiments, the calibration controller applies the target voltage across the calibration pulldown resistor by applying the target voltage at the negative input of the amplifier. In an embodiment, the calibration controller includes a transistor, which receives on its gate terminal the output of the amplifier. The source terminal of the transistor is connected to a current source and the drain terminal is connected to each of the positive input of the amplifier and the calibration pulldown resistor. Referring briefly again to calibration circuitry 200 (of FIG. 2), the current source 240 conveys the calibration current, which is indicated by "I_Calibration," through the configurable resistor 210. The amplifier 220 and the pfet 222 provide the target voltage, VTarget 204, across the configurable calibration pulldown resistor (configurable resistor 210).

In an embodiment, a communication protocol specifies that a signal interface uses one or more ODT pulldown termination resistors, each equal to a target resistor, for one or more metal traces. In addition, the communication protocol specifies the target voltage, which is a percentage of the supply voltage. The supply voltage (power supply voltage or input voltage) is a maximum voltage level of signals transmitted over signal lines. The target voltage indicates a voltage level that is a degraded form of the supply voltage and still provides a minimally acceptable data transfer rate. For example, the target voltage is two thirds, fourth fifths, or another fraction of the supply voltage. In some embodiments, the communication protocol also determines a value for the reference resistor. The reference resistor is also referred to as the external precision resistor. In various embodiments, the calibration circuitry includes a single external precision resistor for calibrating each of the configurable pullup resistor and the configurable pulldown resistor.

The same current source that generates the calibration current through the calibration pulldown resistor also conveys, through a reference resistor, a reference current that is based on the calibration current (block 506). In various embodiments, the current source is a current mirror and the reference current is a fraction of the calibration current. Referring briefly again to calibration circuitry 200, the current source 240 generates the output voltage as the drain voltage of pfet 248 by conveying the reference current through the reference resistor 230.

The comparator compares the generated second voltage to a reference voltage, such as VRef 206 (of FIG. 2), which is based on the communication protocol. In an embodiment, the comparator generates an initial result when the configurable resistor is set to its initial value such as the maximum resistor value. In one example, the initial result of the comparison is a logic low level. The initial result is also based on how the second voltage is compared to the reference voltage. For example, when an operational amplifier is used for the comparison, which polarity input receives the second voltage affects the comparison result. In another example, the initial result of the comparison is a logic high level.

If the comparator determines the comparison between the reference voltage and the second voltage does not change from its initial result ("no" branch of the conditional block 508), then a calibration controller adjusts (tunes) the calibration pulldown resistor (block 510). For example, when the calibration controller sets the configurable resistor to an initial value equal to a maximum resistor value, the calibration controller later tunes the configurable resistor by reducing the value of the configurable resistor. However, when the calibration controller sets the initial resistor to a minimum resistor value, the calibration controller later tunes the configurable resistor by increasing the value of the configurable resistor. Afterward, control flow of method 500 returns to block 504 where the current source conveys the calibration current through the configurable calibration pulldown resistor.

In some embodiments, the configurable resistor is implemented by dozens or hundreds of voltage controlled metal oxide semiconductor (MOS) field effect transistors (FETs). Control logic receives or generates a code, and translates the code to a number of powered-on control lines connected to gate terminals of the MOSFETs (or fets), which determines the number of enabled nfets. The greater the number of nfets that are enabled, the more capable is the configurable resistor to conduct current and the lower the resistance of the configurable resistor. In contrast, the less the number of nfets that are enabled, the less capable is the configurable resistor to conduct current and the higher the resistance of the configurable resistor. In other embodiments, pfets are used in place of nfets and the control lines are set to a ground reference voltage to enable pfets. Other implementations of the configurable resistor are possible and contemplated.

If the comparator determines the comparison between the reference voltage and the second voltage does changes from its initial value ("yes" branch of the conditional block 508), then the calibration controller stores the value of the calibration pulldown resistor (block 512). In some embodiments, the calibration controller completes calibration. In other embodiments, the calibration controller tunes the configurable pulldown resistor a second time, but starting with another initial value. If the calibration controller determines that calibration has completed ("yes" branch of the conditional block 514), then the calibration controller conveys information to one or more controllers corresponding to multiple receivers or transceivers. The information specifies a value of the configurable pulldown resistor at the point in time that calibration completed. One or more controllers set one or more pulldown resistors of signal interfaces to the resistor value indicated by the received information (block 516). If the calibration controller determines that calibration has not completed ("no" branch of the conditional block 514), then control flow of method 500 returns to block 502 where the calibration controller sets the configurable pulldown resistor to another initial resistor.

Figure 6:
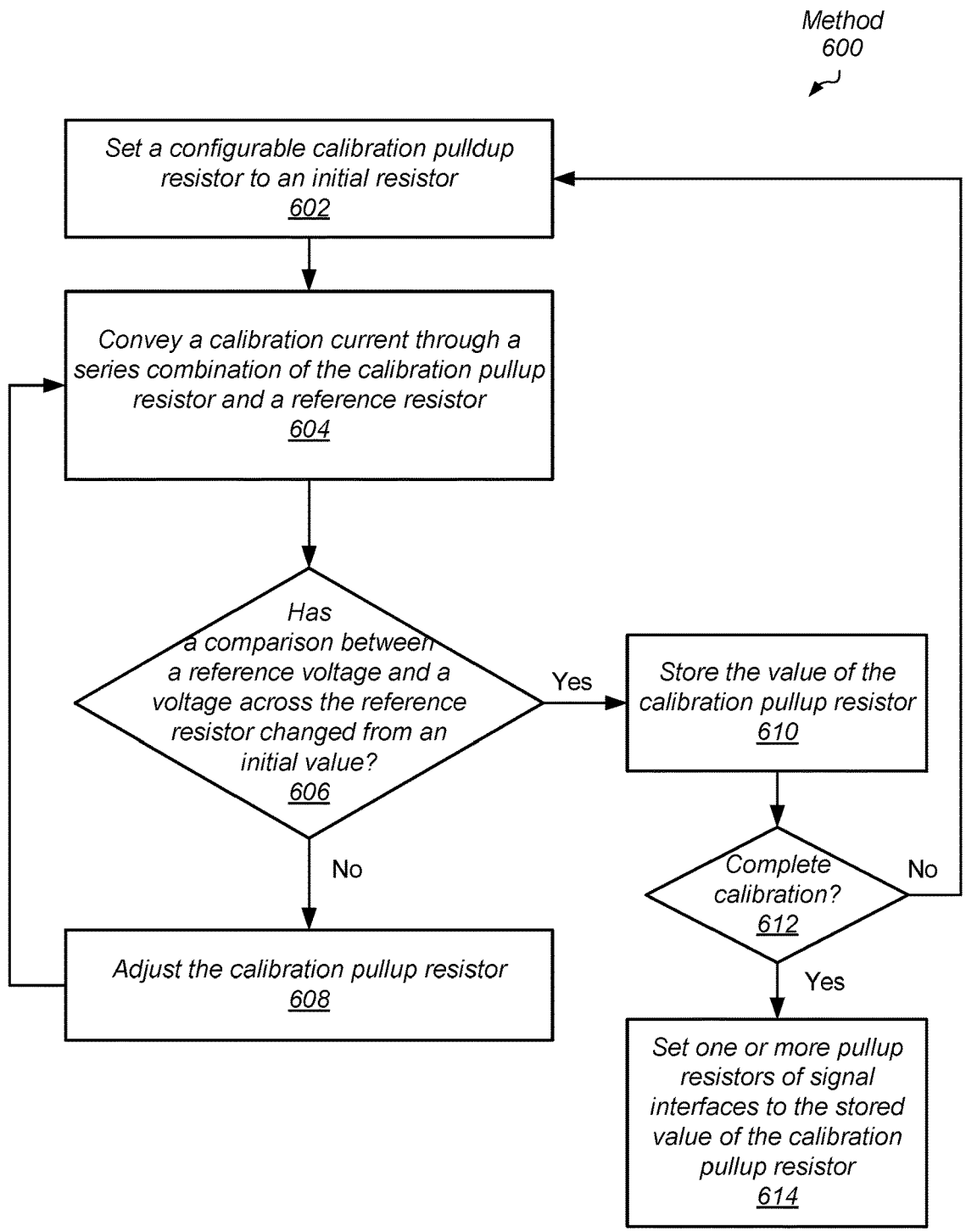
FIG. 6 is a flow diagram of one embodiment of a method for calibrating an on-die termination resistor in a computing system.

Turning to FIG. 6, one embodiment of a method 600 for calibrating an on-die termination resistor in a computing system is shown. During a calibration stage for a signal interface, a replica of each of a configurable (tunable) pullup resistor and a configurable (tunable) pulldown resistor is individually and independently calibrated. In other words, neither of the configurable pullup resistor and the configurable pulldown resistor is dependent on the other for their respective calibration. The separate calibration processes are one step calibration processes instead of dependent two step processes. The calibrated values of each of the configurable pullup resistor and the configurable pulldown resistor is used by on-die termination pullup and pulldown resistors during a later data transmission stage. However, during a later data receiving stage, only on-die termination pullup resistor is used, whereas, the configurable pulldown resistor is not used.

For the calibration of the configurable pullup resistor, a replica of the configurable on-die pullup resistor is calibrated. During the calibration, a calibration controller sets the configurable on-die pullup resistor to an initial resistor (block 602). In one embodiment, the initial resistor is a maximum resistor for the configurable on-die pullup resistor (or configurable resistor). In another embodiment, the initial resistor is a minimum resistor for the configurable pullup resistor. A current source conveys a calibration current through a series combination of the configurable pullup resistor and a reference resistor (block 604). In various embodiments, the same communication protocol used for calibrating the configurable pulldown resistor is also used to specify the target voltage and the reference resistor (external precision resistor). In various embodiments, the calibration circuitry includes a single external precision resistor for calibrating each of the configurable pullup resistor and the configurable pulldown resistor.

In an embodiment, a comparator generates an initial result when the configurable pullup resistor is set to its initial value such as the maximum resistor value. In one example, the initial result of the comparison is a logic low level. The initial result is based on how an output voltage across the external precision resistor compares to the reference voltage. For example, when an operational amplifier is used for the comparison, which polarity input receives the reference voltage affects the comparison result. In another example, the initial result of the comparison is a logic high level.

If the comparator determines the comparison between the reference voltage and the output voltage across the external precision resistor does not change from its initial result ("no" branch of the conditional block 606), then a calibration controller adjusts the calibration pullup resistor (block 608). For example, when the calibration controller sets the configurable pullup resistor to an initial value equal to a maximum resistor value, the calibration controller later tunes the configurable pullup resistor by reducing the resistor. Afterward, control flow of method 600 returns to block 604 where the current source generates the output voltage across the external precision resistor (reference resistor) by conveying the calibration current through the series combination of the configurable pullup resistor and the external precision resistor (reference resistor).

If the comparator determines that the comparison between the reference voltage and the output voltage across the external precision resistor changes from its initial result ("yes" branch of the conditional block 606), then the calibration controller stores the value of the calibration pullup resistor (block 610). In some embodiments, the calibration controller completes calibration. In other embodiments, the calibration controller tunes the configurable pullup resistor a second time, but starting with another initial value.

If the calibration controller determines that calibration has completed ("yes" branch of the conditional block 612), then the calibration controller conveys information to one or more controllers corresponding to multiple receivers or transceivers. The information specifies a value of the configurable pullup resistor at the point in time that calibration completed. One or more controllers set one or more pullup resistors of signal interfaces to the resistor value indicated by the received information (block 614). If the calibration controller determines that calibration has not completed ("no" branch of the conditional block 612), then control flow of method 600 returns to block 602 where the calibration controller sets the configurable pullup resistor to another initial resistor.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
a configurable calibration resistor;
a load between a supply voltage and the configurable calibration resistor;
a reference resistor; and
a calibration controller;
wherein the calibration controller is configured to:
set the configurable calibration resistor to a first initial value;
maintain a target voltage across the configurable calibration resistor, wherein the target voltage is less than or equal to the supply voltage;
determine a first initial result by comparing a reference voltage to a given voltage across the reference resistor based at least in part on the configurable calibration resistor, wherein the first initial result indicates whether the given voltage is greater than the reference voltage;
change a resistance of the configurable calibration resistor; and
store a first value of the configurable calibration resistor, in response to determining a comparison of the given voltage and the reference voltage generates a first final result different from the first initial result.

2. The circuit as recited in claim 1, wherein the circuit further comprises a first amplifier and a current source, wherein:
the first amplifier is configured to generate a calibration current by providing the target voltage across the configurable calibration resistor; and
the current source is configured to generate the given voltage by conveying, through the reference resistor, a reference current that is based on the calibration current.

3. The circuit as recited in claim 2, wherein the target voltage and the reference resistor correspond to parameters of a communication protocol specifying a signal interface using one or more pulldown termination resistors.

4. The circuit as recited in claim 2, wherein the calibration current is greater than the reference current.

5. The circuit as recited in claim 2, wherein the circuit further comprises a first transistor, wherein:
the first amplifier is further configured to:
receive the target voltage on a negative input; and
receive the target voltage on a positive input; and
the first transistor is configured to:
receive an output of the first amplifier on a gate terminal;
receive the calibration current from the current source on a source terminal; and
convey the calibration current through a drain terminal to the configurable calibration resistor.

6. The circuit as recited in claim 5, wherein the circuit further comprises a second transistor between the current source and the reference resistor, and wherein the current source comprises a current mirror that includes:
a first resistor between a power supply and the first transistor;
a second resistor between the power supply and the second transistor; and
a second amplifier configured to adjust the reference current through the second transistor, responsive to comparing voltage drops across the first resistor and the second resistor.

7. The circuit as recited in claim 1, wherein the calibration controller is further configured to:
set the configurable calibration resistor to a second initial value different from the first initial value;
maintain the target voltage across the configurable calibration resistor, wherein the load is a model of loading provided by a configurable on-die termination (ODT) pullup resistor in ODT circuitry;
determine a second initial result by comparing the reference voltage to the given voltage;
adjust the configurable calibration resistor; and
store a second value of the configurable calibration resistor, in response to determining a comparison of the given voltage and the reference voltage generates a second final result different from the second initial result.

8. The circuit as recited in claim 7, wherein the calibration controller is further configured to:
determine an average value of the first value of the configurable calibration resistor and the second value of the configurable calibration resistor; and
send, to one or more external controllers for setting pulldown termination resistors on a signal interface, an indication that specifies the average value.

9. A method, comprising:
setting, by a calibration controller, a configurable calibration resistor to a first initial value, wherein a load is placed between a supply voltage and the configurable calibration resistor;
maintaining a target voltage across the configurable calibration resistor, wherein the target voltage is less than or equal to the supply voltage;
determining, by the calibration controller, a first initial result by comparing a reference voltage to a given voltage across a reference resistor based at least in part on the configurable calibration resistor, wherein the first initial result indicates whether the given voltage is greater than the reference voltage;
adjusting, by the calibration controller, the configurable calibration resistor; and
storing, by the calibration controller, a first value of the configurable calibration resistor, in response to determining a comparison of the given voltage and the reference voltage generates a first final result different from the first initial result.

10. The method as recited in claim 9, further comprising:
generating, by a first amplifier, a calibration current by providing the target voltage across the configurable calibration resistor; and
generating, by a current source, the given voltage by conveying, through the reference resistor, a reference current that is based on the calibration current.

11. The method as recited in claim 10, wherein the target voltage and the reference resistor correspond to parameters of a communication protocol specifying a signal interface using one or more pulldown termination resistors.

12. The method as recited in claim 10, wherein the calibration current is greater than the reference current.

13. The method as recited in claim 9, further comprising:
setting the configurable calibration resistor to a second initial value different from the first initial value;
maintaining the target voltage across the configurable calibration resistor, wherein the load is a model of loading provided by a configurable on-die termination (ODT) pullup resistor in ODT circuitry;
determining a second initial result by comparing the reference voltage to the given voltage;
adjusting the configurable calibration resistor; and
storing a second value of the configurable calibration resistor, in response to determining a comparison of the given voltage and the reference voltage generates a second final result different from the second initial result.

14. The method as recited in claim 13, further comprising:
determining an average value of the first value of the configurable calibration resistor and the second value of the configurable calibration resistor; and
sending, to one or more external controllers for setting pulldown termination resistors on a signal interface, an indication that specifies the average value.

15. An apparatus comprising:
a plurality of receivers configured to receive signals;
a plurality of transmitters configured to send a plurality of signals to the plurality of receivers;
wherein a given receiver of the plurality of receivers is configured to receive a first signal of the plurality of signals from a given transmitter of the plurality of transmitters;
wherein the given receiver comprises:
a configurable calibration resistor;
a load between a supply voltage and the configurable calibration resistor;
a reference resistor; and
a calibration controller; and
wherein the calibration controller is configured to:
set the configurable calibration resistor to a first initial value;
maintain a target voltage across the configurable calibration resistor, wherein the target voltage is less than or equal to the supply voltage;
determine a first initial result by comparing a reference voltage to a given voltage across a reference resistor based at least in part on the configurable calibration resistor, wherein the first initial result indicates whether the given voltage is greater than the reference voltage;
adjust the configurable calibration resistor; and
store a first value of the configurable calibration resistor, in response to determining a comparison of the given voltage and the reference voltage generates a first final result different from the first initial result.

16. The apparatus as recited in claim 15, wherein the given receiver further comprises a first amplifier and a current source, wherein:

the first amplifier is configured to generate a calibration current by providing the target voltage across the configurable calibration resistor; and the current source is configured to generate the given voltage by conveying, through the reference resistor, a reference current that is based on the calibration current.

17. The apparatus as recited in claim 16, wherein the target voltage and the reference resistor correspond to parameters of a communication protocol specifying a signal interface using one or more pulldown termination resistors.

18. The apparatus as recited in claim 16, wherein the calibration current is greater than the reference current.

19. The apparatus as recited in claim 15, wherein the calibration controller is further configured to:

set the configurable calibration resistor to a second initial value different from the first initial value;

determine a second initial result by comparing the reference voltage to the given voltage;

maintain the target voltage across the configurable calibration resistor, wherein the load is a model of loading provided by a configurable on-die termination (ODT) pullup resistor in ODT circuitry;

adjust the configurable calibration resistor; and store a second value of the configurable calibration resistor, in response to determining a comparison of the given voltage and the reference voltage generates a second final result different from the second initial result.

20. The apparatus as recited in claim 19, wherein the calibration controller is further configured to:

determine an average value of the first value of the configurable calibration resistor and the second value of the configurable calibration resistor; and send, to the plurality of receivers, for setting pulldown termination resistors on a signal interface, an indication that specifies the average value.

* * * * *